(12) United States Patent
Mori et al.

(10) Patent No.: US 6,214,479 B1
(45) Date of Patent: Apr. 10, 2001

(54) COVERED MEMBER AND METHOD OF PRODUCING THE SAME

(75) Inventors: Hiroyuki Mori; Hideo Tachikawa, both of Aichi-ken (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 0 days.

(21) Appl. No.: 09/091,414

(22) PCT Filed: Oct. 17, 1997

(86) PCT No.: PCT/JP97/03757

§ 371 Date: Jun. 23, 1998

§ 102(e) Date: Jun. 23, 1998

(87) PCT Pub. No.: WO98/17838

PCT Pub. Date: Apr. 30, 1998

(30) Foreign Application Priority Data

Oct. 23, 1996 (JP) .................................................. 8-281102

(51) Int. Cl.[7] .............................. B32B 9/00; B32B 15/00; C23C 8/20; C23C 14/00
(52) U.S. Cl. .......................... 428/612; 428/651; 428/652; 428/665; 428/666; 428/141; 428/142; 428/469; 148/317; 148/318; 148/319; 148/239; 148/316; 427/532; 427/533; 427/570; 204/192
(58) Field of Search ..................................... 428/612, 141, 428/142, 650, 651, 652, 649, 665, 666, 405, 469; 427/523, 532, 533, 530, 528, 535, 534, 564, 566, 569, 570, 255.11, 255.21; 148/210, 212, 225, 230, 220, 316, 317, 318, 319, 239, 217; 250/492.3; 204/192

(56) References Cited

U.S. PATENT DOCUMENTS

| | | | |
|---|---|---|---|
| 5,108,813 | * 4/1992 | Noda et al. | 428/141 |
| 5,137,784 | * 8/1992 | Suzuki et al. | 428/408 |
| 5,318,091 | 6/1994 | Pavoni et al. . | |
| 5,364,684 | 11/1994 | Sadamoto et al. . | |
| 5,759,419 | * 6/1998 | Mochida et al. | 216/22 |
| 5,928,759 | * 7/1999 | Arita et al. | 428/141 |
| 5,976,714 | * 11/1999 | Arita et al. | 428/694 |

FOREIGN PATENT DOCUMENTS

| | | |
|---|---|---|
| 62-202071 | 9/1987 | (JP) . |
| 63-227719 | 9/1988 | (JP) . |
| 1-294875 | 11/1989 | (JP) . |
| 2-4962 | 1/1990 | (JP) . |
| 2-110829A | * 4/1990 | (JP) . |
| 2-156066 | 6/1990 | (JP) . |
| 2-285065 | 11/1990 | (JP) . |
| 4-48077 | 2/1992 | (JP) . |
| 4-280973 | 10/1992 | (JP) . |
| 5-63500 | 3/1993 | (JP) . |
| 5-311439 | 11/1993 | (JP) . |
| 6-108253 | 4/1994 | (JP) . |
| 7-96702 | 10/1995 | (JP) . |
| 8-49060 | 2/1996 | (JP) . |
| 8-311652 | 11/1996 | (JP) . |

* cited by examiner

Primary Examiner—Deborah Jones
Assistant Examiner—Bryant Young
(74) Attorney, Agent, or Firm—Oblon, Spivak, McClelland, Maier & Neustadt, P.C.

(57) ABSTRACT

This invention provides a covered member which possesses a high bond strength of a base material and a covering film, and has a smooth surface. The covered member comprises a base material and a covering film and the surface of the base material to be covered with the covering film is characterized by an uneven surface having projections with an average height in the range from 10 to 100 nm and an average width of not more than 300 nm. The uneven surface can be formed by ion impacting. A surface of a covering film formed on that is smooth since the unevenness of the surface is extremely fine.

21 Claims, 1 Drawing Sheet

500nm

500nm

COVERED MEMBER AND METHOD OF PRODUCING THE SAME

BACKGROUND OF THE INVENTION

1. Field of the Invention

The present invention relates to a covered member which is formed by covering a base material such as irons and steels with a hard film and which is improved in bond strength of the base material and the covering film, and to a method of producing the same.

2. Description of the Background

Widely used is a covered member which is produced by forming a metallic film, a ceramic film, a carbon-base film, or the like of several to tens of microns in thickness on a surface of irons, steels or the like by physical vapor deposition (PVD) or chemical vapor deposition (CVD), and which comprises the base material, and the covering film covering a surface of this base material. The bond strength of the base material and the covering film, which constitute this covered member, becomes a problem and in some cases the film is peeled off. For example, in the art of employing PVD and applying a hard film to a base material which has a low temperature of 600° C. or less, the bond strength of the base material and the covering film is small because of low temperature, and the film is often peeled off.

In such a case, as means of increasing the bond strength of the base material and the covering film, there have so far been employed a method of cleaning a base material surface by sputtering the base material surface, a method of roughening a base material surface by blasting the base material surface, and so on.

In using a covered member as a sliding member, it is important that its covering film is smooth and bond strength of the covering film and a base material is high. When the covering film is not smooth, seizure resistance is low and a tendency to attack a mating member is increasing. When the bond strength of the covering film and the base material is insufficient, the film is peeled off and the covered member cannot be used as a sliding member.

However, in the sputtering method, although organic stains and oxides can be removed from the surface, it is often that a desired bond strength is not obtained in the case of low temperature film application. In the blasting method, the base material surface is greatly roughened into an uneven surface with projections and concaves of about several microns at the minimum, so a smooth film cannot be obtained. Hence, the surface roughness of a hard film thereafter formed deteriorates. For instance, when used as a sliding member, the covered member rather abrades a mating member and desired sliding characteristics cannot be obtained. Accordingly, when the covered member is used, for example, as a sliding member which needs to have a smooth surface, repolishing of the hard film is sometimes required.

SUMMARY OF THE INVENTION

It is an object of the present invention to provide a covered member which is free from those problems, possesses a high bond strength of a base material and a covering film, and has a smooth surface, and a method of producing the same.

DETAILED DESCRIPTION OF THE PREFERRED EMBODIMENTS

Figure 1:
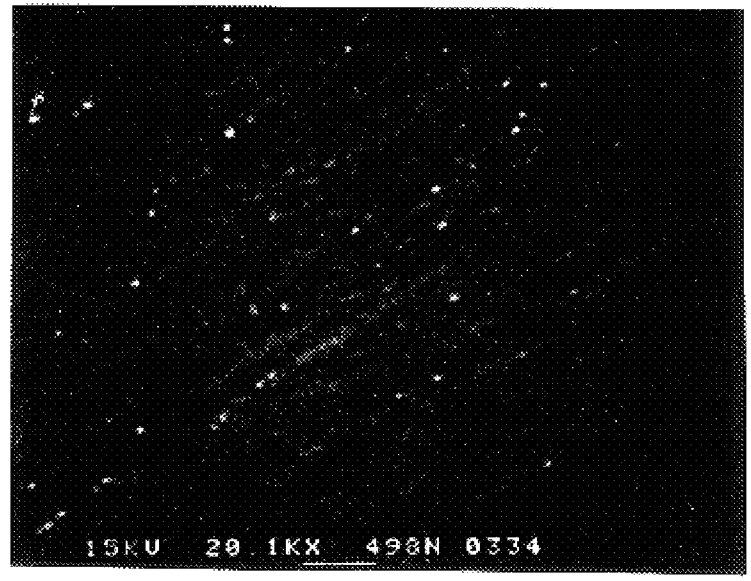
FIG. 1 is a SEM photograph showing the state of projections on Specimen No. 11 of preferred embodiments, obtained by ion impacting.

The present inventors have found and confirmed that by making a base material surface to be covered with a covering film into an uneven surface having projections with a predetermined extremely small height and a predetermined width, it becomes possible to obtain a covered member which possesses a high bond strength of the base material and the covering film and has a smooth surface. The present inventors have thus completed the present invention.

The covered member of the present invention is a covered member comprising a base material and a covering film covering a surface of the base material, and is characterized in that the base material surface covered with the covering film is an uneven surface having projections with an average height in the range from 10 to 100 nm and an average width of not more than 300 nm.

The present inventive method of producing a covered member is characterized in comprising a first step of forming, on a base material surface to be covered, projections with an average height in the range from 10 to 100 nm and an average width of not more than 300 nm by ion impacting beforehand, so as to make the base material surface into an uneven surface, and a second step of forming a covering film on the uneven surface.

Because an interface between the base material and the covering film are uneven surfaces having projections with a predetermined height and width, the bond between them is strong and a covered member with improved integrality is obtained.

The covered member of the present invention comprises a base material and a covering film. The base material constitutes various components or parts of apparatus such as a substrate, a sliding member, and a structural member, and is formed of metal. On the other hand, the covering film is to cover at least part of a surface of this base material and to add such functions as corrosion resistance, abrasion resistance, and decoration to the surface. The covering film is a metallic film, a ceramic film, or a carbon-base film formed by various applying methods.

Examples of metal constituting the base material are iron-base metals such as steels, metals such as titanium, aluminum, copper, and magnesium, and alloys of these metals. Examples of a metallic film constituting the covering film are chromium, nickel, tungsten and the like. Examples of a ceramic film are a nitride film, a carbide film, and an oxide film, comprising one of the elements in group IV to group VI of the periodic table or composite elements containing one of these elements. Examples of a carbon-base film are diamond-like carbon (DLC) and diamond.

The base material surface to be covered with the covering film is an uneven surface having projections with an average height in the range from 10 to 100 nm and an average width of not more than 300 nm. The projections have a hemispherical shape. Note that the height of a projection means a distance from the bottom to the vertex of this hemispherical projection, and that the width of a projection means a horizontal distance corresponding to the maximum length of the bottom of the hemispherical projection (a diameter in the case where the projection bottom shape is a true circle, and a major axis length in the case where the projection bottom shape is an ellipse).

The reason why the average height should range from 10 to 100 nm is that when the average height is less than 10 nm, a mechanical anchoring effect cannot be obtained and bond strength becomes insufficient, and that, on the other hand, when the average height exceeds 100 nm, a smooth film cannot be obtained. It is more preferable that the average height ranges from 20 to 70 nm. In this range, bond strength is further improved.

The reason why the average width should be not more than 300 nm is that when the average width exceeds 300 nm, an anchoring effect cannot be obtained and bond strength decreases. Note that the size of projections cannot be measured by a conventional surface roughness tester (a tracer method). For this reason, here, projection size and width is measured by microshape measuring methods such as scanning electron microscope (SEM) observation and AFM.

If projection areas are small, no effect on the bond strength of the film can be exhibited despite of a predetermined projection size. The ratio of the projection areas to the whole area of an uneven surface is preferably not less than 30% when the whole area of the uneven surface is assumed as 100%. When the projection areas are 30% or more, the bond strength of the film is high.

The present inventive method of producing a covered member comprises a first step of making a base material surface into an uneven surface, and a second step of forming a covering film on this uneven surface.

As the method of forming an uneven surface in the first step, the ion impacting method can be employed. By this ion impacting method, projections with an average height in the range from 10 to 100 nm and an average width of not more than 300 nm are formed on a base material surface to be covered, so as to make the base material surface into an uneven surface.

For ion impacting, a base material to be treated is placed in an air-tight chamber and the pressure in the air-tight chamber is controlled to about $10^{-3}$ to 20 torr. When the pressure is less than $10^{-3}$ torr, the material to be treated cannot be heated sufficiently. When the pressure is more than 20 torr, the material to be treated can be heated but cannot attain ultrafine unevenness.

Next, ultrafine-unevenness pretreatment gas is introduced into the chamber. This ultrafine-unevenness pretreatment gas may be one or more rare gases of helium, neon, argon, krypton, xenon, and radon. Further, in the case of an iron-base base material, adding hydrogen to the ultrafine-unevenness pretreatment gas can prevent oxidation of the material surface to be treated.

Ion impacting is given under these conditions. As the means for giving ion impacting, glow discharge or ion beam can be employed. When ion impacting is carried out with a discharge voltage of 200 to 1000V, an electric current of 0.5 to 3.0 A and a treating time of 30 to 60 minutes, uniform ultrafine unevenness on the nano order can be formed. If the material to be treated is heated to a temperature at which hardness is not lowered (at least 200° C. is needed) while ion impacting is given, more uniform and more ultrafine unevenness on the nano order can be obtained.

In the case of an iron-base material, it is better to form before ion impacting a nitriding layer, a carburizing layer or a soft nitriding layer on a surface of the material to be treated, by carrying out any one of ordinary gas nitriding treatment, carburizing treatment, and gas soft nitriding treatment. Formation of the nitriding layer, the carburizing layer, or the soft nitriding layer makes it easy to form very uniform and ultrafine unevenness on the nano order by the ion impacting method. Note that unevenness can be formed by ion impacting subsequently after the nitriding layer, the carburizing layer, or the soft nitriding layer is formed in an ion impacting apparatus.

As for the method of forming a covering film in the second step, the covering film can be formed by ion plating (an arc process, a hollow cathode process, etc.), sputtering, vacuum deposition, plasma CVD and so on. Since the base material surface is an uneven surface, the covering film thus formed adheres to the surface strongly. Besides, the obtained covering film has a smooth surface with little unevenness. In regard to CVD, because the treatment is carried out at high temperatures, relatively good bond strength is exhibited without forming microfine unevenness in the first step of the present invention. Therefore the formation of ultrafine unevenness in the first step has little effect.

After the second step is carried out and a covering film is formed, there is no need to apply aftertreatment such as polishing or lapping of the formed covering film. Taking the first step and the second step of the present invention appropriately enables formation of a smooth covering film which does not require polishing or lapping.

The covered member of the present invention can be used as a sliding member which requires abrasion resistance. For instance, the covered member of the present invention can be used as machine parts in sliding motion, e.g. sliding portions of engine parts (a piston, piston rings, a valve stem, etc.), compressor parts (vanes, shoes, etc.), a fuel-injection pump (a rotor, a plunger, etc.).

In the covered member of the present invention, the interface between the base material and the covering film is an uneven surface having projections with an average height in the range from 10 to 100 nm and an average width of not more than 300 nm. Owing to this micro unevenness of the interface, the bond area increases. In response to this increase in bond area, bond strength increases. In addition, since the base material surface has been cleaned and activated by forming this uneven surface, a strong covering film is formed. Moreover, owing to the mechanical anchoring effect of concaves formed at the boundary of projections, the base material and the covering film are mechanically combined, so stronger bond can be obtained.

Furthermore, since the unevenness of the uneven surface of the base material is as ultrafine as 10 to 100 nm, the unevenness of the base material is not reproduced on a covering film surface, and accordingly the covering film surface is smooth.

Note that by forming a nitriding layer, a carburizing layer, or a soft nitriding layer on the base material surface beforehand, projection formation by ion impacting becomes easy, and the projections become ultrafiner and the ratio of the area occupied by the projections per unit area becomes higher. This results in large increase in the contact area of the base material and the covering film, so the bond strength is further improved.

BEST MODES FOR CARRYING OUT THE INVENTION

In the following experiment, nitriding steel SACM645 was used as a base material and formed into test specimens of 50×10×7 mm in dimension. The base material had a surface roughness of Rz 0.1 μm.

Examination on Unevenness-Forming Conditions

Examination was conducted on conditions for forming unevenness on a base material surface. The aforementioned nitriding steel was employed as a base material and gas nitriding treatment in $NH_3$ gas at 520° C. for 35 hours was applied, whereby a nitriding diffusion layer of about 0.4 mm in thickness was formed on the base material surface. Then, the base material surface was polished so as to have a surface roughness of Rz 0.1 μm.

Argon gas was used as gas for ion impacting treatment for forming unevenness, and hydrogen was added as oxidation-preventing gas. The gas pressure was 4 torr, and the voltage and electric current were 100 V and 0.4 A, and 200 V and 0.8 A. The treatment time was 0, 5, and 50 minutes. This ion impacting treatment produced projections described in Table 1. Note that the surface roughness remained to be Rz 0.1 μm even after the ion impacting treatment.

Thereafter, a hard film of DLC-Si (silicon-contained diamond-like carbon) was formed on the base material surface by plasma CVD. The hard film had a thickness of 3 μm.

The bond strength of the obtained hard film was evaluated by an indentation test and a scratch test. The indentation test was to evaluate bond strength of the hard film by pressing a Rockwell C-scale indenter against the film with a pressure of 150 kg and observing whether the film around an indented portion was peeled off or not. The scratch test is to scratch a surface with a conical diamond having a vertical angle of 120° and a point of 0.2 mm in radius with a given load. The load at the time when the film is peeled off is called critical load, and the bond strength of the hard film is evaluated by the value of that critical load. Evaluation results are shown in Table 1.

As apparent from Table 1, sufficient bond strength could not be obtained with an average projection height of 5 nm. It is clear that ion impacting treatment with a voltage of 200 V, an electric current of 0.8 A and a treating time of 40 minutes was required as conditions for forming unevenness.

Examination on Base Material Surface Hardening Conditions Affecting Unevenness Formation Projections were formed under the same ion impacting conditions as used for forming unevenness on Specimen No. 3 in Table 1 by using three kinds of test specimens: one which underwent no hardening treatment, one which underwent the same nitriding treatment as the specimens in Table 1, and one which underwent carburizing treatment. Then, a hard DLC-Si film of 3 μm in thickness was formed on each base material surface by the same plasma-CVD as used for the specimens in Table 1. After that, bond strength of each obtained hard film was evaluated by an indentation test and a scratch test in the same way as the films of the specimens in Table 1 were evaluated. The results are shown together in Table 2.

Note that the carburizing treatment was carried out by using case hardening steel as a base material and placing that steel in a salt bath at 900° C. for one hour. The obtained carburizing layer had a thickness of 0.4 mm.

TABLE 2

| SPECIMEN NO. | SURFACE HARDENING TREATMENT | DIMENSIONS OF PROJECTIONS | | | CRITICAL LOAD IN SCRATCH TEST (N) | PEELING OFF AFTER INDENTATION TEST |
| --- | --- | --- | --- | --- | --- | --- |
| | | AVE. HEIGHT (nm) | AVE. WIDTH (nm) | OCCUPIED AREA (%) | | |
| 11 | NONE | 30 | 20 | 20 or less | 25 | OBSERVED |
| 12 | NITRIDING | 70 | 70 | 80 | 55 | NONE |
| 13 | CARBURIZING | 30 | 20 | 60 | 40 | NONE |

It is apparent from Table 2 that the base material surface is preferably subjected to hardening treatment before ion-impacting treatment for forming unevenness. In the case of Specimen No. 11 which underwent no surface hardening treatment, even the ion impacting treatment with a voltage of 200 V, an electric current of 0.8 A and a treating time of 40 minutes did not form sufficient unevenness. Hence, bond strength was not sufficient.

It is clear that nitriding or carburizing the base material surface beforehand made it easy to form unevenness by ion impacting treatment.

Figure 2:
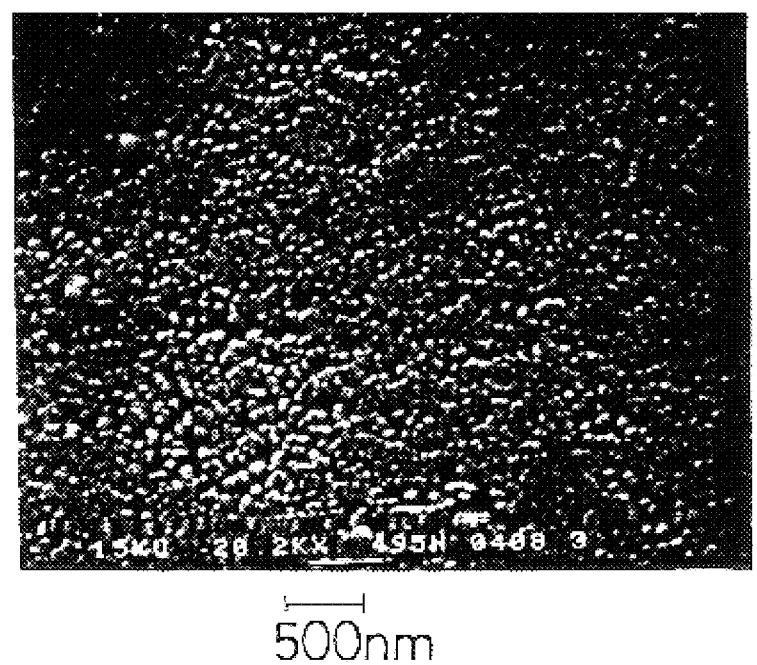
FIG. 2 is a SEM photograph showing the state of projections on Specimen No. 12 of preferred embodiments, obtained by ion impacting.

For reference, SEM photographs of uneven surfaces of Specimen Nos. 11 and 12 after the ion impacting treatment was applied and before hard films were formed are respectively shown in FIGS. 1 and 2. These figures demonstrate that hemispherical projections were formed by ion impact-

TABLE 1

| SPECIMEN NO. | CONDITIONS FOR FORMING PROJECTIONS | | | DIMENSIONS OF PROJECTIONS | | | CRITICAL LOAD IN SCRATCH TEST (N) | PEELING OFF AFTER INDENTATION TEST |
| --- | --- | --- | --- | --- | --- | --- | --- | --- |
| | VOLTAGE (V) | ELECTRIC CURRENT (A) | TIME (min) | AVE. HEIGHT (nm) | AVE. WIDTH (nm) | OCCUPIED AREA (%) | | |
| 1 | 100 | 0.4 | 15 | 0 | 0 | 0 | 10–20 | YES |
| 2 | 200 | 0.8 | 15 | 5 | 5 | 5 | 20 | YES |
| 3 | 200 | 0.8 | 40 | 50 | 70 | 70 | 50 | NONE | ing. Less projections are formed on Specimen No. 11 as shown in FIG. 1. On the other hand, FIG. 2 shows that the projections are formed all over the surface of Specimen No. 12.

Total Evaluation Test

Four kinds of specimens in total were prepared by employing TiN as hard covering films. As for surface hardening by nitriding, two kinds of specimens, i.e.

untreated and treated ones were prepared. As for unevenness formation, two kinds of specimens, i.e. unevenness-formed and unformed ones were prepared. Thereafter, an indentation test and a scratch test were conducted in the same way as done to the specimens in Table 1, thereby evaluating bond strength of the hard film. The results are shown together in Table 3.

Nitriding treatment was carried out in the same way as done to the specimens in Table 1. Ion impacting treatment for forming unevenness was carried out with a voltage of 400 V, an electric current of 1.5 A and a treating time of 1 hour. TiN covering films were formed by arc ion plating with a treating temperature of 400° C. and a treating time of 1 hour. Covering TiN films of 3 μm in thickness were thus formed.

TABLE 3

| SPECIMEN NO. | MATERIAL OF HARD COATING FILM | SURFACE HARDENING TREATMENT | UNEVENNESS FORMATION | DIMENSIONS OF PROJECTIONS | | | CRITICAL LOAD IN SCRATCH TEST (N) |
|---|---|---|---|---|---|---|---|
| | | | | AVE. HEIGHT (nm) | AVE. WIDTH (nm) | OCCUPIED AREA (%) | |
| 21 | TiN | NONE | NONE | 0 | 0 | 0 | 40 |
| 22 | TiN | NONE | FORMED | 40 | 30 | 20 | 60 |
| 23 | TiN | TREATED | NONE | 0 | 0 | 0 | 50 |
| 24 | TiN | TREATED | FORMED | 50 | 40 | 70 | 80 |

As apparent from Table 3, unevenness formation resulted in an improvement in bond strength, and besides, the specimens which underwent surface hardening treatment before unevenness formation were further improved in bond strength.

What is claimed is:

1. A covered member, comprising a base material on a covering film which covers a surface of said base material, wherein the surface of said base material covered with said covering film is an uneven surface having projections with an average height in the range of from 10 to 100 nm and an average width of not more than 300 nm.

2. The covered member according to claim 1, wherein said base material is formed of metal.

3. The covered member according to claim 2, wherein said metal is one of iron-base metals, titanium, aluminum, copper, magnesium, and alloys of these metals.

4. The covered member according to claim 1, wherein said covering film is a metallic film, a ceramic film, or a carbon-base film.

5. The covered member according to claim 4, wherein said metallic film is a chromium film, a nickel film, or a tungsten film.

6. The covered member according to claim 4, wherein said ceramic film is a nitride film, a carbide film, or an oxide film comprising one of the elements in group IVB to group VIB of the periodic table, or composite elements containing one of these elements.

7. The covered member according to claim 4, wherein said carbon-base film is a DLC (diamond-like carbon) film or a diamond film.

8. The covered member according to claim 1, wherein said projections have a hemispherical shape.

9. The covered member according to claim 1, wherein said projections have an average height in the range from 20 to 70 nm.

10. The covering member according to claim 1, wherein area occupied by said projections is 30% or more when the whole area of said uneven surface is assumed as 100%.

11. The covered member according to claim 1, wherein said base material is an iron-base material having a nitride layer, a carbide layer, or a soft nitride layer on its surface.

12. A method of producing a covered member, comprising the steps of:
   a) forming, on a base material surface to be covered, projections with an average height in the range of from 10 to 100 nm and an average width of not more than 300 nm by ion impacting beforehand, so as to make said base material surface into an uneven surface, and then
   b) forming a covering film on said uneven surface.

13. The method of producing a covered member according to claim 12, wherein said ion impacting is carried out under a pressure of $10^{-3}$ to 20 torr.

14. The method of producing a covered member according to claim 12, wherein said ion impacting is carried out in an atmosphere of one or more rare gases comprising helium, neon, argon, krypton, xenon, or radon.

15. The method of producing a covered member according to claim 14, wherein said rare gas atmosphere contains hydrogen.

16. The method of producing a covered member according to claim 12, wherein said ion impacting is carried out by a glow discharge or an ion beam.

17. The method of producing a covered member according to claim 16, wherein said glow discharge is carried out at a discharge voltage in the range from 200 to 1000V, at an electric current in the range from 0.5 to 3.0 A, for a treating time in the range from 30 to 60 minutes.

18. The method of producing a covered member according to claim 12, wherein said ion impacting is carried out at a temperature which does not decrease the hardness of said material to be treated.

19. A method of producing a covered member according to claim 12, wherein said base material is an iron-base material, and a nitride layer, a carbide layer, or a soft nitride layer is formed on a surface of said iron-base metal by gas nitriding treating, carburizing treatment, or gas soft nitriding treatment, before said base material is subject to said ion impacting.

20. The method of producing a covered member according to claim 19, wherein said ion impacting follows said gas nitriding treatment, said carburizing treatment, or said gas soft nitriding treatment continuously in one apparatus.

21. The method of producing a covered member according to claim 12, wherein said forming a covering film step is ion plating, sputtering, vacuum evaporation, or plasma CVD.

* * * * *